United States Patent [19]

Matsumoto

[11] Patent Number: 5,630,217
[45] Date of Patent: May 13, 1997

[54] ERROR-FREE PULSE NOISE CANCELER USED IN FM TUNER

[75] Inventor: Yutaka Matsumoto, Yokohama, Japan

[73] Assignee: Kabushiki Kaisha Toshiba, Kawasaki, Japan

[21] Appl. No.: 360,299

[22] Filed: Dec. 21, 1994

[30] Foreign Application Priority Data

| Dec. 21, 1993 | [JP] | Japan | 5-322239 |
| Dec. 7, 1994 | [JP] | Japan | 6-304041 |

[51] Int. Cl.⁶ .................................................. H04B 1/10
[52] U.S. Cl. ........................ 455/222; 455/225; 455/224; 455/223
[58] Field of Search ............................ 455/205, 303, 455/306, 312, 212, 213, 223, 224, 225, 272, 254, 295; 381/94, 13; 375/351; 329/320

[56] References Cited

U.S. PATENT DOCUMENTS

| 4,246,441 | 1/1981 | Sugai et al. | 455/223 |
| 4,314,377 | 2/1982 | Kondo et al. | 455/223 |
| 4,419,541 | 12/1983 | Kishi et al. | 455/223 |
| 4,480,335 | 10/1984 | Kishi | 455/212 |
| 4,833,715 | 5/1989 | Sakai | 381/13 |
| 4,908,581 | 3/1990 | Honjo | 329/320 |
| 4,994,754 | 2/1991 | Ohta | 329/320 |
| 5,036,543 | 7/1991 | Ueno | 381/13 |
| 5,255,319 | 10/1993 | Nakamura et al. | 455/223 |
| 5,383,224 | 1/1995 | Mizoguchi | 455/295 |

FOREIGN PATENT DOCUMENTS 0172590   2/1986   European Pat. Off. .

OTHER PUBLICATIONS

Copy of European Search Report, Mar. 8, 1996.

Primary Examiner—Reinhard J. Eisenzopf
Assistant Examiner—Marsha D. Banks-Harold
Attorney, Agent, or Firm—Oblon, Spivak, McClelland, Maier, & Neustadt, P.C.

[57] ABSTRACT

A pulse noise canceler in which the sensibility of FM pulse noise detection is decreased when an FM wave exceeding the minimum bandwidth which is predetermined of an FM wave detector is input to the pulse noise canceler. In order to detect pulse noise from an output from the FM wave detector in an FM tuner to open a holding gate, an FM pulse noise detector is constituted by a high-pass filter, a variable control amplifier, a full wave detector, and the like. An over deviation detector is constituted by a signal meter for detecting a received field strength, an attenuator, and a high-pass filter, thereby detecting an over deviation level of the FM wave detector. This detection output from the over deviation detector is input to a bottom peak detector and becomes an over deviation signal. An over deviation signal from the over deviation detector is incorporated in the arrangement of a noise AGC amplifier in the FM pulse noise detector to influence control of the holding gate.

24 Claims, 15 Drawing Sheets

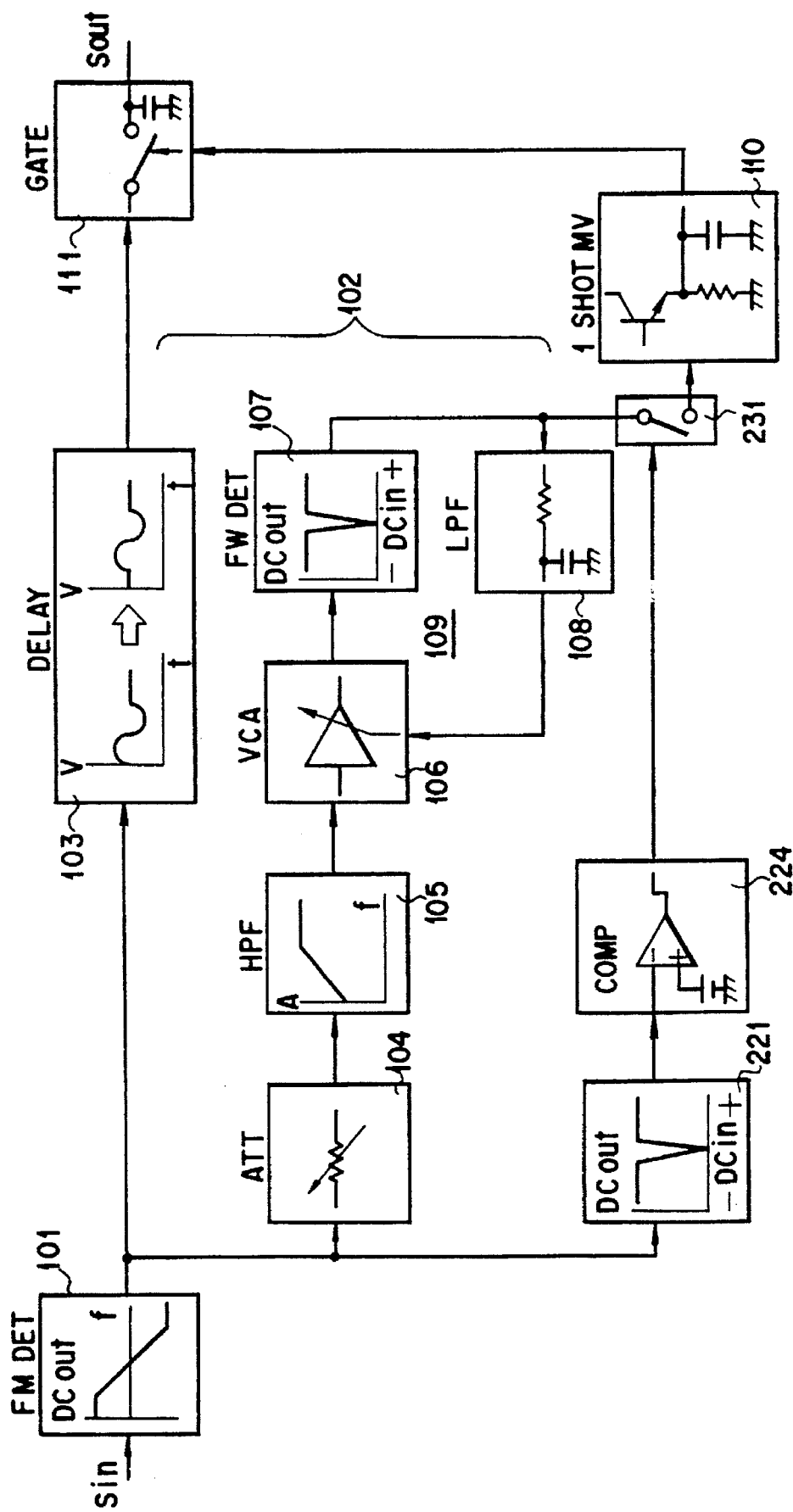
F I G. 42

ERROR-FREE PULSE NOISE CANCELER USED IN FM TUNER

BACKGROUND OF THE INVENTION

1. Field of the Invention

The present invention relates to a pulse noise canceler applied to an FM tuner and, particularly, an automobile audio tuner, applied to mobile reception.

2. Description of the Related Art

FIG. 1 is a block diagram showing the arrangement of a conventional noise canceler applied to an FM tuner. An FM signal Sin is demodulated by an FM wave detector 101, and an output from the FM wave detector 101 is supplied to an FM pulse noise detector 102 and a delay circuit 103. The pulse noise sensibility of the pulse noise detector 102 is set by an attenuator 104, and a detection signal from the attenuator 104 is input to a variable control amplifier (VCA) 106 through a high-pass filter 105. In addition, an output from the VCA 106 is full-wave-rectified by a full wave detector 107. The output from the full wave detector 107 is fed back to the VCA 106 through a low-pass filter 108. This arrangement for feedback control is called a noise AGC (automatic gain controller) (109). The pulse noise detection signal is supplied to a one-shot multivibrator 110 through the noise AGC 109.

The delay circuit 103 delays a composite signal, including a pulse noise and output from the FM wave detector 101, by a time corresponding to a time required for causing the FM pulse noise detector 102 to operate the one-shot multivibrator 110. An output from the delay circuit 103 is supplied to a holding gate 111 for holding an input amplitude obtained immediately before a functional operation is performed. The holding gate 111 is opened for a predetermined period of time by a signal from the one-shot multivibrator 110 to control transmission of a signal. More specifically, during a period in which a level determined as a pulse noise by the FM pulse noise detector 102 is kept, an FM signal 10 from the delay circuit 103 is pre-held not to transmit the pulse noise to an audio signal terminal Sout.

In a received field strength at which limiter characteristics are out of THD (total harmonic distortion) including noise of an output from an FM tuner is called a threshold point Vth. This threshold point Vth is generally set to be about 10 dBμV in an automobile audio tuner at present.

FIG. 2 shows the curves of noise and THD levels. The curves show the threshold point Vth of the overall tuner described above. In addition, FIGS. 3A to 3D are graphs showing the relationship between a threshold line Vth1 of an FM wave detector set depending on the threshold point Vth and an FM detection band, the relationship between the threshold line Vth1 and over deviation level detection, and the relationship between the threshold line Vth1 and an FM detection output. When the FM tuner receives an electric field having a strength lower than the threshold point Vth, FM demodulation distortion is abruptly increased by an IF (intermediate frequency) filter or the like for determining the minimum bandwidth of the tuner itself. In particular, when the FM tuner receives an FM deviation wave having a frequency exceeding the bandwidth of the IF filter or the like, the FM demodulation distortion is abruptly increased. More specifically, in FIG. 2, when Vd>Vth is almost satisfied, the increase rates of THD curves THD1 and THD2 are relatively proportional to the increase rate of the noise curve. However, when Vd<Vth is almost satisfied, an over deviation distortion 115 whose increase rate is not proportional to the increase rate of the noise curve is formed as in THD curve THD2.

More specifically, the spectra of over deviation distortions (harmonics) range in harmonics of higher orders, and have a frequency bandwidth (FIG. 3A). In this case, when Vd>Vth is almost satisfied, and the input level of the FM wave detector exceeds the threshold line Vth1, therefore a hatched portion 117 is removed by a limiter action, and no amplitude is found in an over deviation level detection output. However, when Vd<Vth is almost satisfied, an over deviation output component 118 having a level and a frequency which are set in accordance with the magnitude of over deviation (FIG. 3B). However, even when Vd>Vth is almost satisfied, when an over deviation level exceeding the bandwidth of the IF filter improved by the limiter action is output, the above drawback may be caused.

The spectra of the harmonics including an over deviation output 125 fall within the passband of the high-pass filter 105 in the FM pulse noise detector 102 in FIG. 1. Therefore, a harmonic is erroneously detected according to a conventional FM pulse noise detecting technique. This erroneous detection will be 10 described below. As shown in FIG. 3C, when an FM wave supposed to be over-deviated is input to the FM wave detector 101, an input to and an output from the FM wave detector 101 exhibit a transmission curve 121 when Vd>Vth is almost satisfied, and a transmission curve 122 when Vd<Vth is almost satisfied. An output actually obtained from the FM wave detector 101 exhibits a curve 123 when Vd>Vth is almost satisfied, and a curve 124 when Vd<Vth is almost satisfied (FIG. 3D). More specifically, when the over deviation output component 118 generated by the over deviation distortion 125 enters the passband of the high-pass filter 105 in FIG. 1, the over deviation output component 118 is erroneously detected by the noise AGC 109 through the full wave detector 107, thereby opening the holding gate 111 (a pre-holding operation is performed). The preheld FM detection output becomes a signal including the over deviation distortion and waveform defect distortion. In this manner, the THD curve THD2 in FIG. 2 becomes a curve 116 including the waveform defect distortion, an increase rate becomes more abrupt. As a result, the received sound becomes noisy sound.

SUMMARY OF THE INVENTION

As described above, in the conventional technique, an FM wave over-deviated input having a field strength almost lower than the threshold point Vth, an over deviation distortion output causes the pulse noise detector to erroneously perform detection. As a result, the FM detection output subjected to a holding process becomes a signal including an over deviation distortion and a waveform defect distortion, very noisy sound is disadvantageously generated. Even when signal having a field strength higher than the threshold point Vth is input, a bandwidth is widened by a limiter action, the same drawback as described above is posed.

The present invention has been made in consideration of the above circumstances, and has as its object to provide a low-cost pulse noise reduction mechanism for preventing FM pulse noise detection from being erroneously performed and for allowing an auditory improvement (an acoustic output) without decreasing an integration density.

The object of the present invention is achieved by the following arrangement.

There is provided a pulse noise canceler used in an FM tuner, comprising:

an FM wave detector for demodulating an FM input signal;

FM pulse noise detecting means for detecting a level of noise to be canceled from an output from the FM wave detector;

over deviation detecting means for detecting a magnitude of the over deviation of an FM wave corresponding to the output signal from the FM wave detector;

transfer control means having a function of holding and controlling the output signal from the FM wave detector in accordance with an output from the FM pulse noise detecting means; and transmission control means for disabling effective transmission of the output from the FM pulse noise detecting means to the transfer control means in accordance with a detection output from the over deviation detecting means.

According to the above arrangement, the over deviation detecting means detects the magnitude of the over deviation of the FM wave of an FM input signal to effectively prevent an original FM pulse noise detecting function from being transmitted to the transfer control means when an over-deviated wave having a frequency exceeding a predetermined band different from that of a noise pulse.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 12 is a block diagram showing the arrangement of the ninth embodiment of the present invention;

DETAILED DESCRIPTION OF THE PREFERRED EMBODIMENTS

Figure 1:
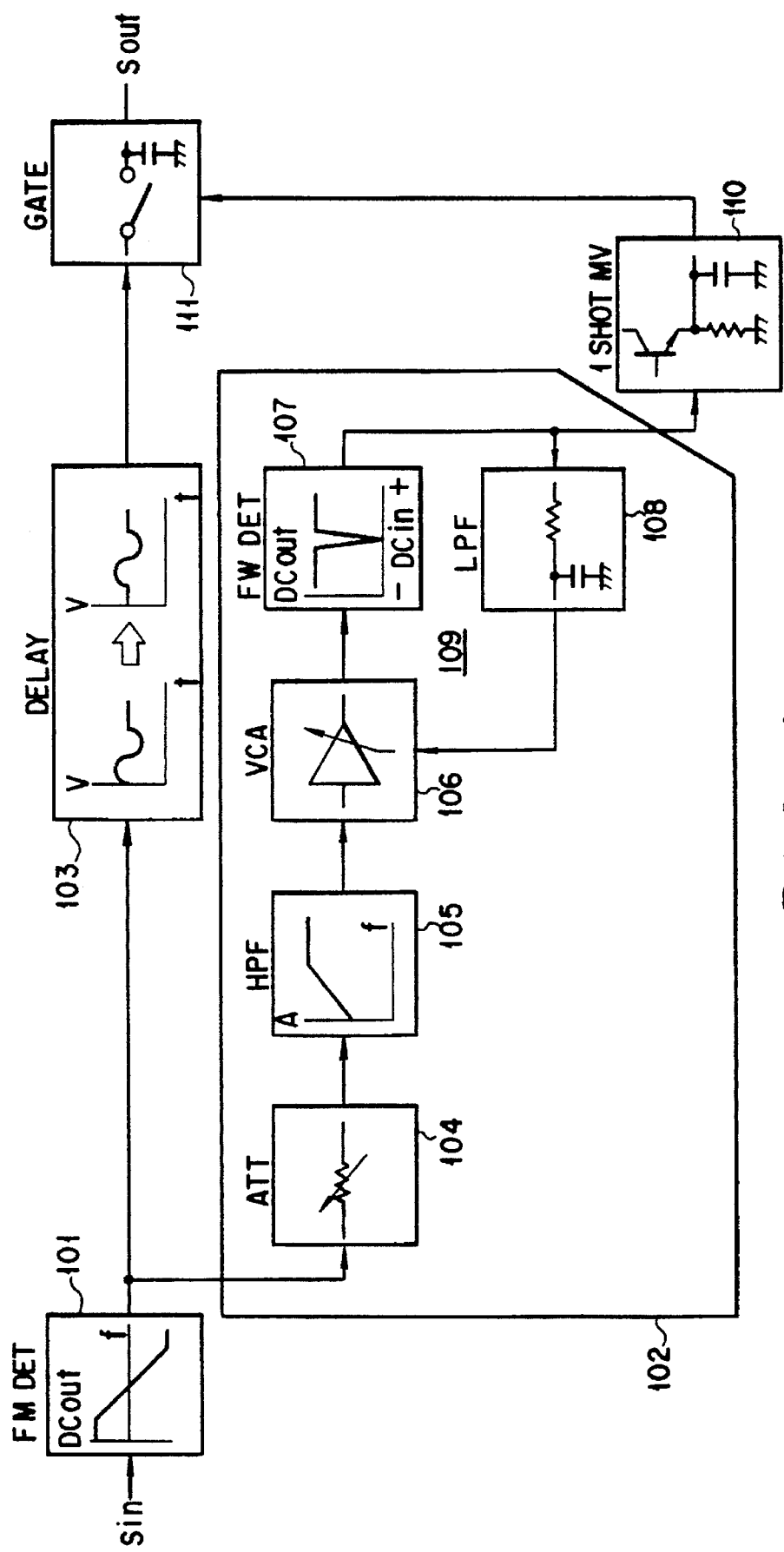
FIG. 1 is a block diagram showing the arrangement of a conventional noise canceler applied to an FM tuner.
Figure 4:
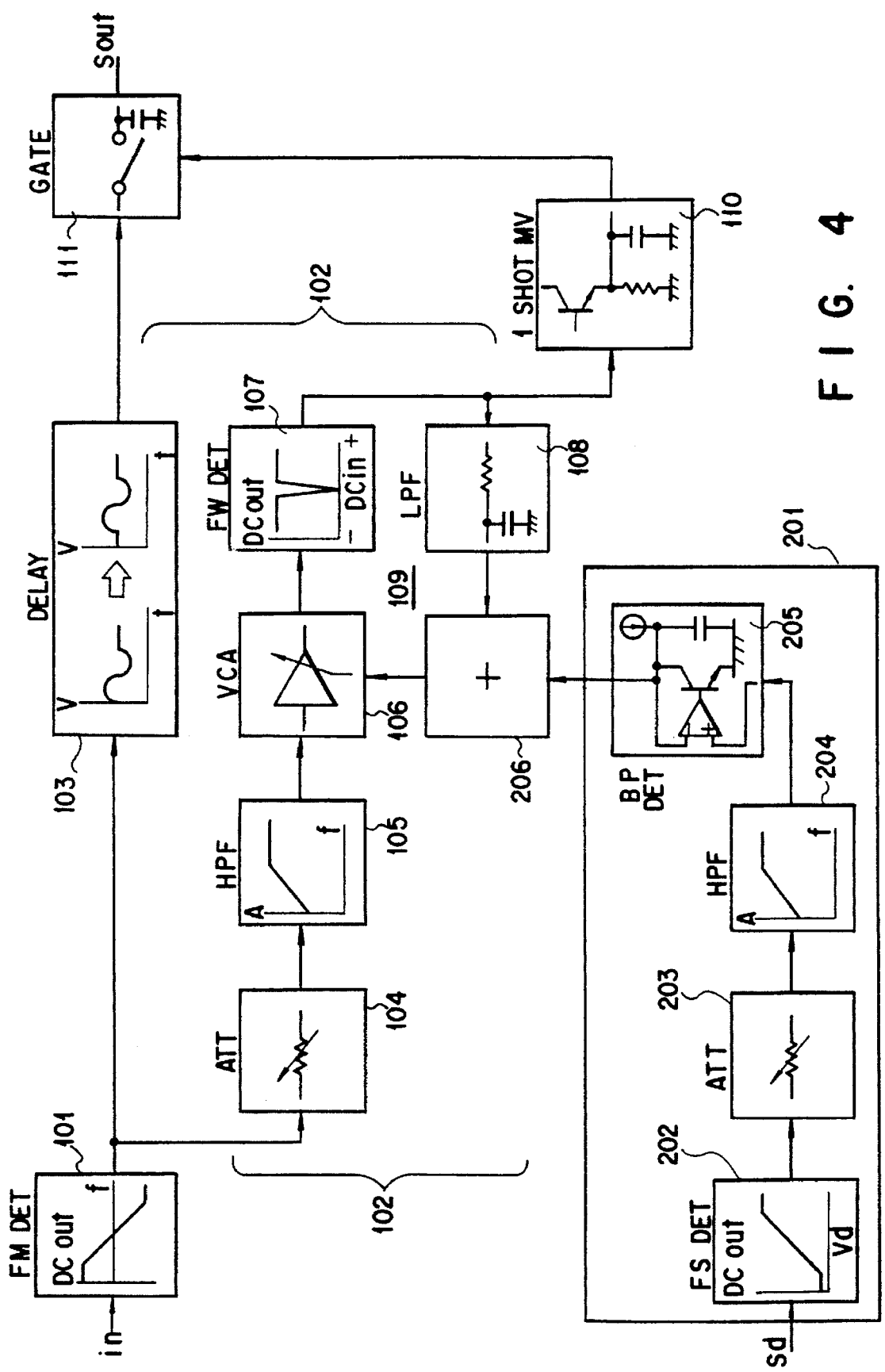
FIG. 4 is a block diagram showing the arrangement of the first embodiment of the present invention.

FIG. 4 is a block diagram showing the arrangement of a pulse noise canceler, applied to an FM tuner, according to the first embodiment of the present invention. This arrangement is obtained such that an over deviation detector 201 for detecting an FM over deviation amount of an FM input signal which almost exceeds the input band of an FM wave detector 101 is added to the arrangement shown in FIG. 1. An output signal from the over deviation detector 201 is incorporated in the arrangement of a noise AGC 109 in an FM pulse noise detector 102. More specifically, the output amount of the over deviation detector 201 is reflected on the noise AGC 109 to decrease the detection sensibility of the FM pulse noise detector 102 in proportion to the output amount of the over deviation detector 201.

FIG. 4 will be described below. An FM signal Sin is demodulated by the FM wave detector 101, and an output from the FM wave detector 101 is supplied to the FM pulse noise detector 102 and a delay circuit 103. In the pulse noise detector 102, a pulse noise sensibility is set by an attenuator 104, and a detection signal from the attenuator 104 is input to a VCA 106 through a high-pass filter 105. In addition, an output from the VCA 106 is full-wave-rectified by a full wave detector 107 to detect a noise level, and the resultant signal passes a noise AGC 109 for feedback-controlling the VCA 106 through a low-pass filter 108. The pulse noise detection signal is supplied to a one-shot multivibrator 110. The delay circuit 103 delays a composite signal containing pulse noise from the output from the FM wave detector 101. An output from the delay circuit 103 is supplied to a holding gate 111 for holding an input amplitude value obtained immediately before a functional operation is performed. The holding gate 111 is controlled by a signal from the one-shot multivibrator 110, and pre-holds the output for a period of time of a level which is determined as a noise level by the FM pulse noise detector 102.

The over deviation detector 201 receives, as an input signal, a field strength signal Sd input according to an FM signal input through an IF filter or the like (not shown) which determines the minimum bandwidth of the tuner itself. The signal Sd is input to a field strength detector 202 (e.g., a signal meter) for detecting a received field strength, and the signal Sd is input to a bottom peak detector 205 through an attenuator 203 and a high-pass filter 204 to almost detect an over deviation level. An output from the bottom peak detector 205, i.e., the output amount of the over deviation detector 201, is added to the control loop of the noise AGC 109 in the FM pulse noise detector 102 through an adder 206. In this manner, during generation of over deviation distortion, the detection sensibility of the FM pulse noise detector 102 is decreased in proportion to the output amount of the over deviation detector 201.

Figure 2:
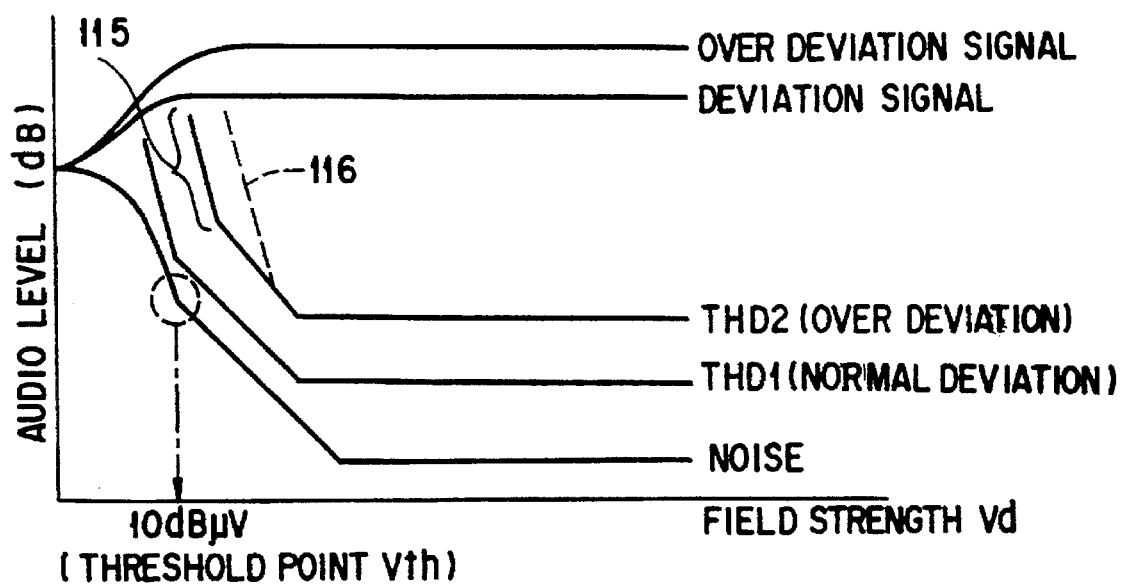
FIG. 2 is a graph showing a noise level and THD levels with reference to a field strength.
Figure 3:
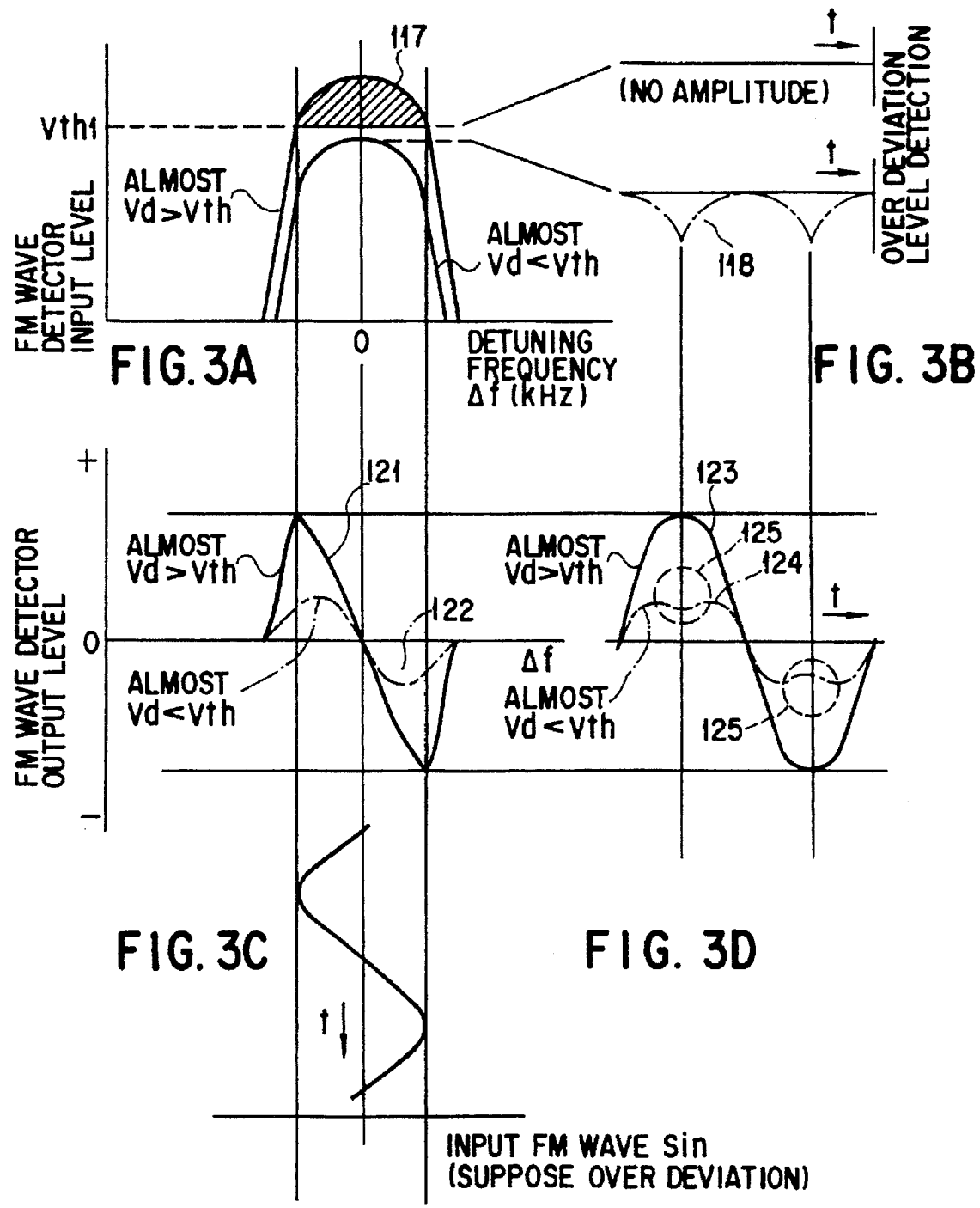
FIGS. 3A to 3D are graphs showing the relationship between a threshold line Vth1 of an FM wave detector set depending on the threshold point Vth and an FM detection band, the relationship between the threshold line Vth1 and over deviation level detection, and the relationship between the threshold line Vth1 and an FM detection output.

With the above arrangement, even in the presence of over deviation, the erroneous detection of the FM pulse noise detector 102 is prevented. More specifically, even in the presence of over deviation, the holding gate 111 does not excessively react, and the holding gate 111 does not excessively sensitively hold an FM signal. Therefore, unlike a THD curve 116 in FIG. 2, a curve free from waveform defect distortion can be obtained. As a result, auditory characteristics can be improved. In addition, since the number of elements to be added is small, an LSI rarely decreases in integration density.

Figure 5:
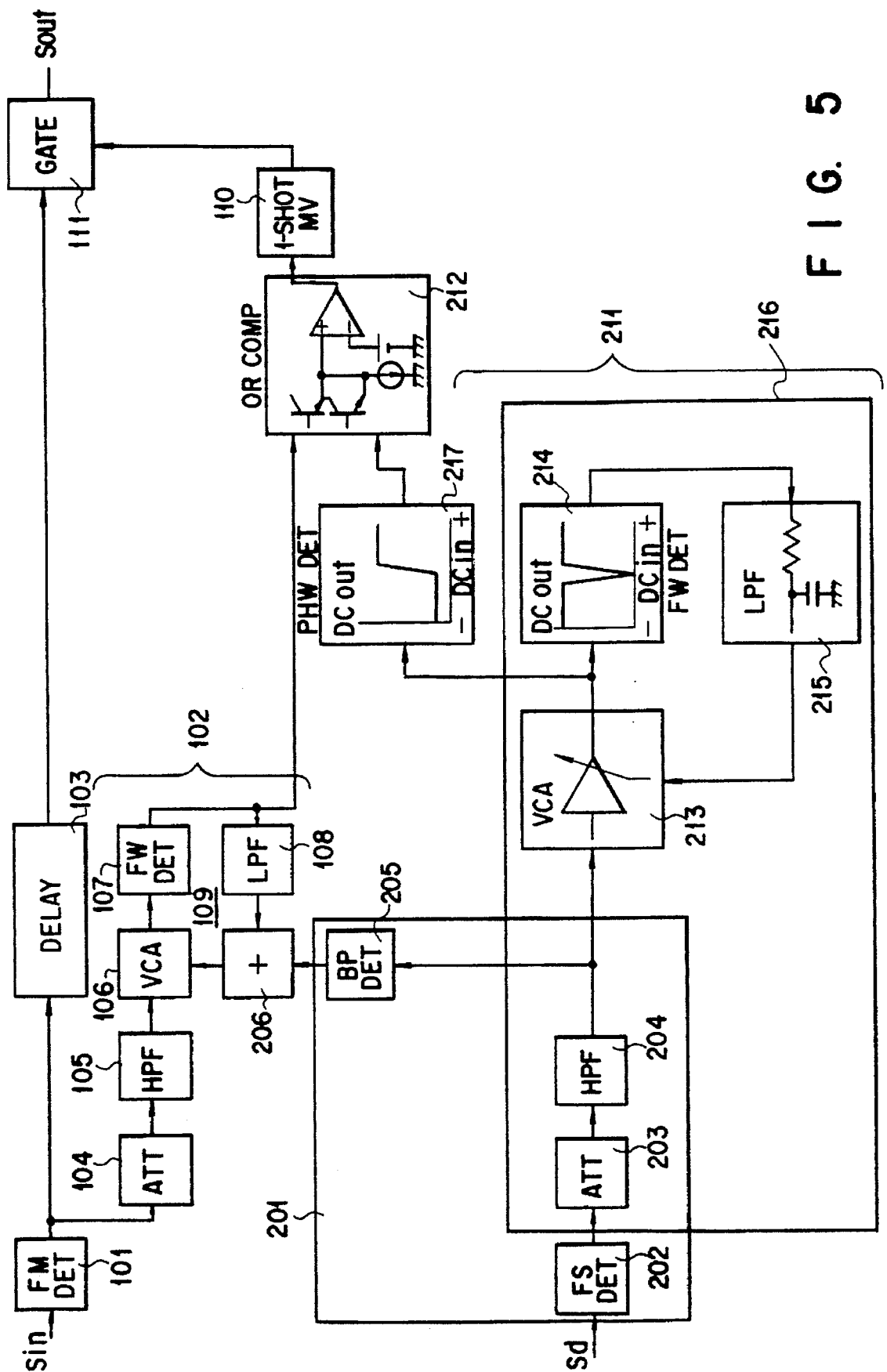
FIG. 5 is a block diagram showing the arrangement of the second embodiment of the present invention.

FIG. 5 is a block diagram showing the arrangement of a pulse noise canceler, applied to an FM tuner, according to the second embodiment of the present invention. The arrangement of FIG. 5 is obtained by adding an AM pulse noise detector 211. In the arrangement of FIG. 5, both output signals from an FM pulse noise detector 102 and the AM pulse noise detector 211 are input to an OR comparator 212. An output from the OR comparator 212 is input to a one-shot multivibrator 110, and a holding gate 111 is controlled by a signal from the one-shot multivibrator 110.

The AM pulse noise detector 211 inputs, to a variable control amplifier (VCA) 213, AM pulse noise generated by a high-pass filter 204. An output from the VCA 213 is full-wave-rectified by a full wave detector 214 and fed back to the VCA 213 through the low-pass filter 215 (noise AGC 216). Original pulse noise is generated by the noise AGC 216. In addition, the output from the VCA 213 is input to a pulse half wave detector 217, and a detection amount obtained by the pulse half wave detector 217 is supplied to the OR comparator 212.

According to the arrangement of the second embodiment, even in the presence of over deviation, when original pulse noise is generated, the original pulse noise is detected by the AM pulse noise detector 211 to open the holding gate 111 (a signal is pre-held). In this manner, although the number of elements of the arrangement of FIG. 5 is larger than that of the arrangement of FIG. 1, stabler pulse noise detection can be performed.

Figure 6:
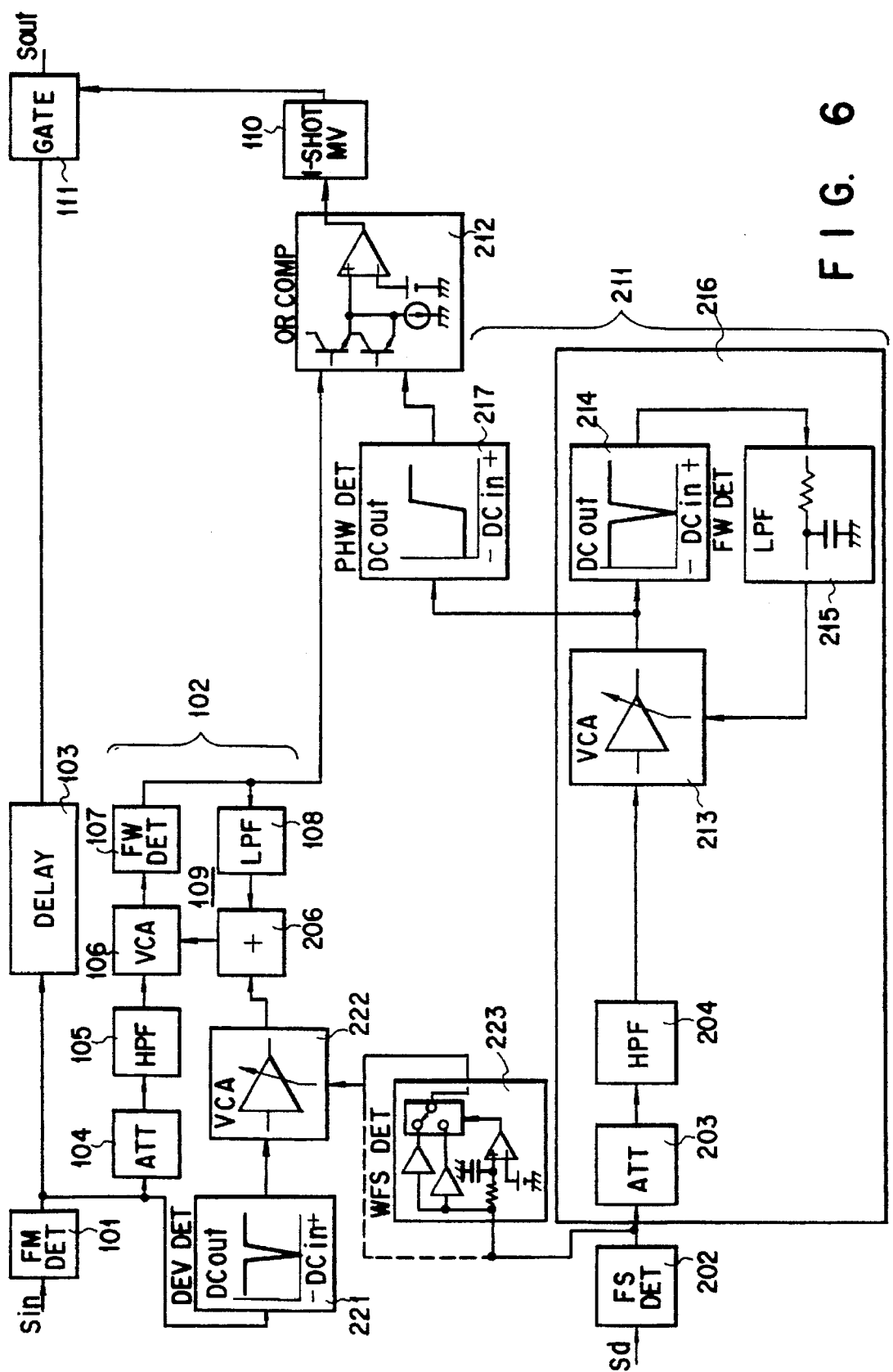
FIG. 6 is a block diagram showing the arrangement of the third embodiment of the present invention.

FIG. 6 is a block diagram showing the arrangement of a pulse noise canceler, applied to an FM tuner, according to the third embodiment of the present invention. The system arrangement of an over deviation detector 201 is slightly different from that in FIG. 5. The remaining circuit arrangement, an AM pulse noise detector 211, and the like are the same as those in FIG. 5. Referring to FIG. 6, a deviation detector 221 for detecting the magnitude of the deviation of the FM demodulation output amount of an output signal from an FM wave detector 101 is arranged, and an output from the deviation detector 221 is supplied to a variable control amplifier (VCA) 222. In addition, the detection signal of a received field strength in a field strength detector 202 is supplied to a weak field strength detector 223. When the weak field strength detector 223 detects a signal level obtained in the presence of a weaker electric field than a threshold point, the weak field strength detector 223 makes an output from the VCA 222 higher than that obtained when the signal level is not detected. In this manner, when the received field strength is low, the VCA 222 operates to increase a gain using an output from the field strength detector 202 as the field strength becomes weaker until the field strength reaches a weak electric field corresponding to the threshold point. In addition, in the presence of a weaker field strength than the threshold point, the VCA 222 operates to increase the gain in consideration of the magnitude of amplification of the weak field strength detector 223. An output from the VCA 222 is supplied to the control loop of a noise AGC 109 through an adder 206.

According to the arrangement of the third embodiment, the same effect as described in the arrangement of the second embodiment can be obtained. More specifically, even in the presence of over deviation, when original pulse noise is generated, the AM pulse noise detector 211 detects the original pulse noise to open a holding gate 111. In addition, since the deviation detector 221 uses an output from the FM wave detector 101, the deviation detector 221 has an excellent capability of preventing an erroneous operation. Therefore, although the number of elements of the arrangement of FIG. 6 is larger than that of the arrangement of FIG. 5, stabler pulse noise detection can be performed. Note that, as indicated by a dotted line in FIG. 6, the field strength detector 202 may be directly connected to the VCA 222 without the weak field strength detector 223, or the weak field strength detector 223 may be omitted. This arrangement also has a capability of preventing an erroneous operation to some extent.

Figure 7:
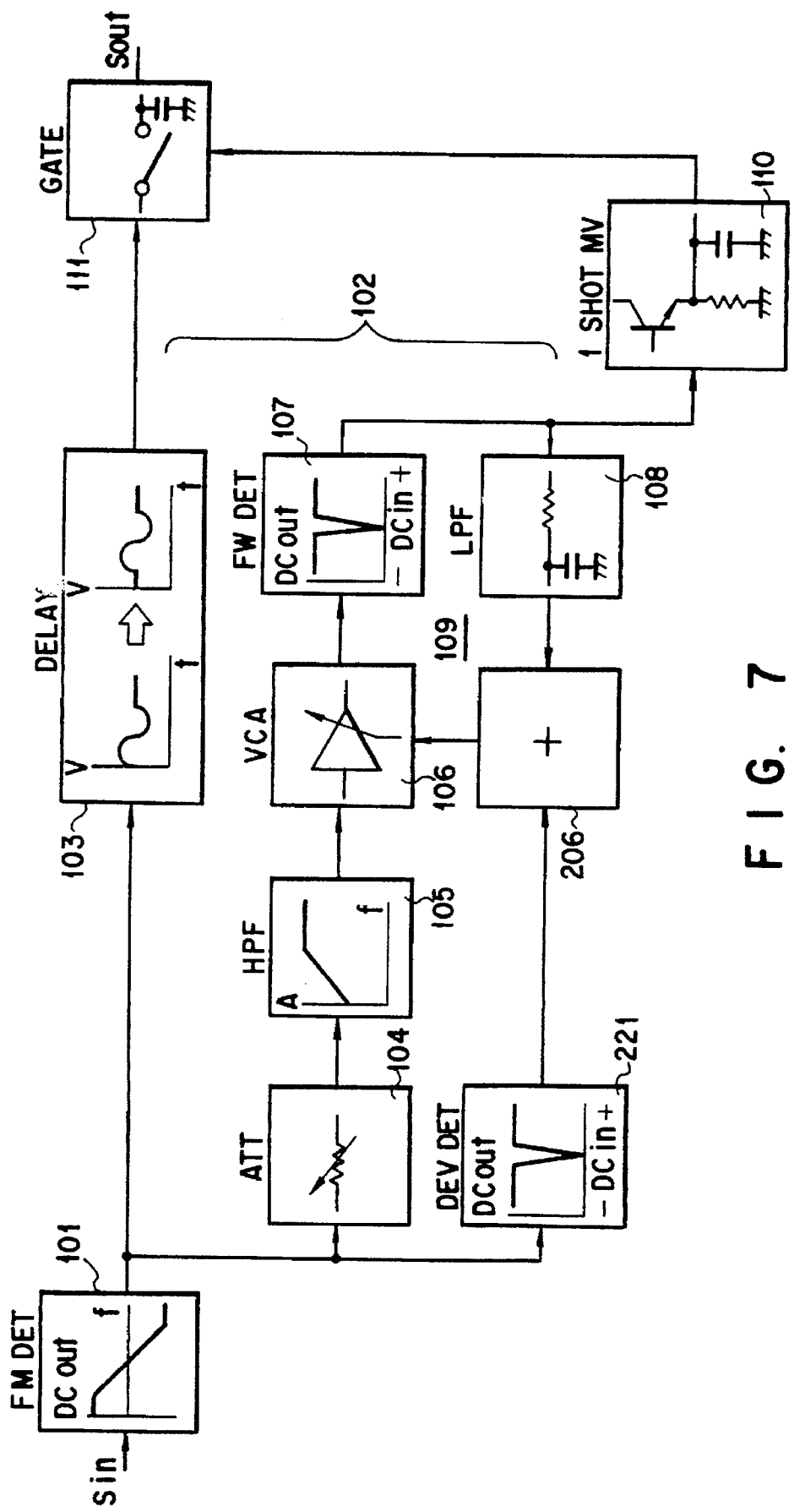
FIG. 7 is a block diagram showing the arrangement of the fourth embodiment of the present invention.

FIG. 7 is a block diagram showing the arrangement of a pulse noise canceler, applied to an FM tuner, according to the fourth embodiment of the present invention. The arrangement of the fourth embodiment is obtained by adding a deviation detector 221 to the arrangement of FIG. 1. More specifically, the deviation detector 221 detects the magnitude of the deviation of the FM demodulation output amount of an output signal from an FM wave detector 101, and an output from the deviation detector 221 is supplied to a VCA 222 through an adder 206. The pulse noise canceler of this embodiment can be constituted by a small number of elements and is optimum for micropatterning and cost reduction, and the deviation detector 221 uses an output from the FM wave detector 101. For this reason, a capability of preventing an erroneous operation can be considerably expected.

Figure 8:
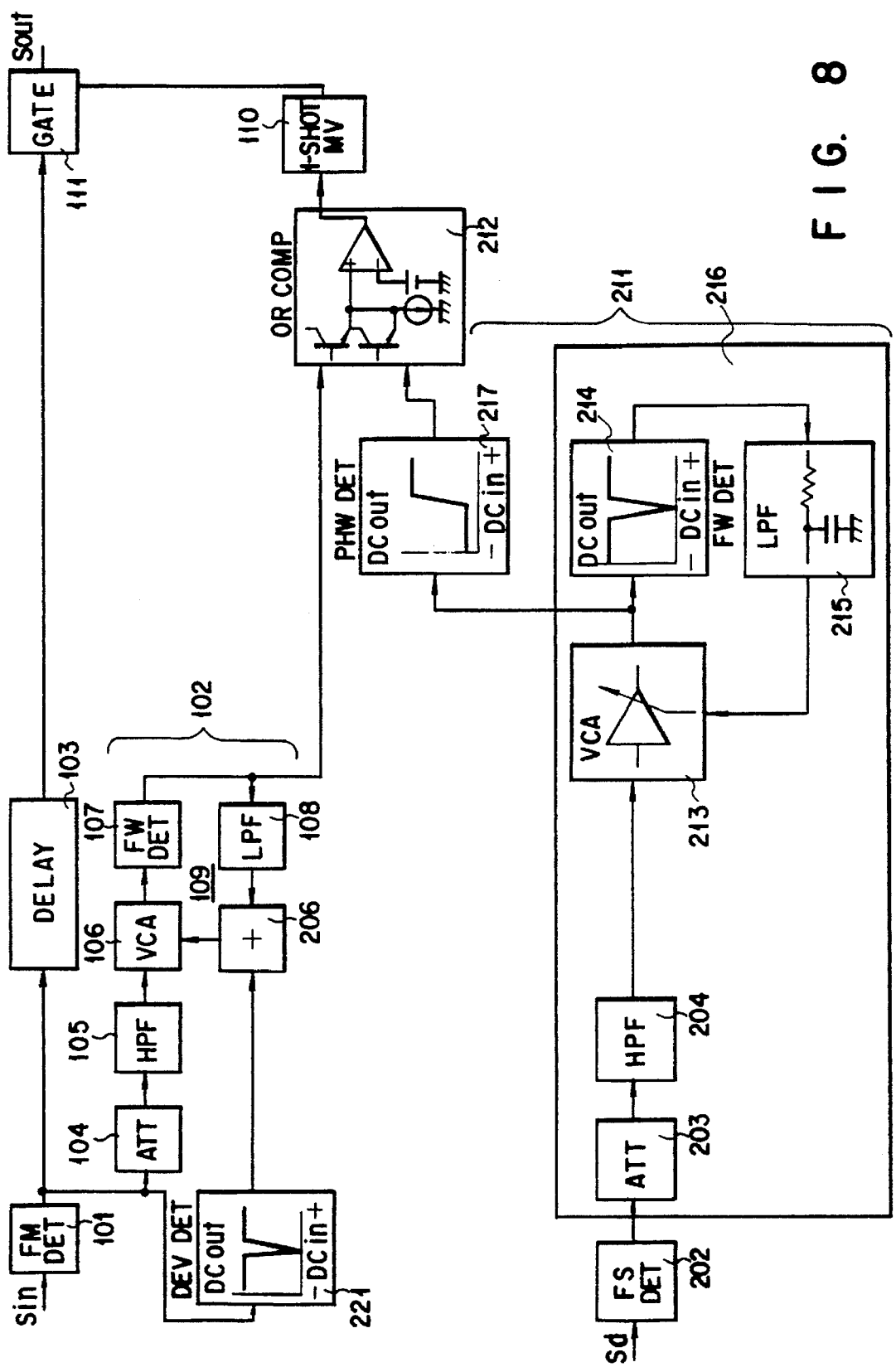
FIG. 8 is a block diagram showing the arrangement of the fifth embodiment of the present invention.

FIG. 8 is a block diagram showing the arrangement of a pulse noise canceler, applied to an FM tuner, according to the fifth embodiment of the present inven- tion. In this arrangement, unlike in the arrangement of FIG. 6, the transmission arrangement of a weak field strength detector 223 and a VCA 222 is omitted, and an output from a deviation detector 221 is supplied to a VCA 106 through an adder 206. This arrangement is obtained by adding an AM pulse noise detector 211 to the arrangement of FIG. 7.

Figure 9:
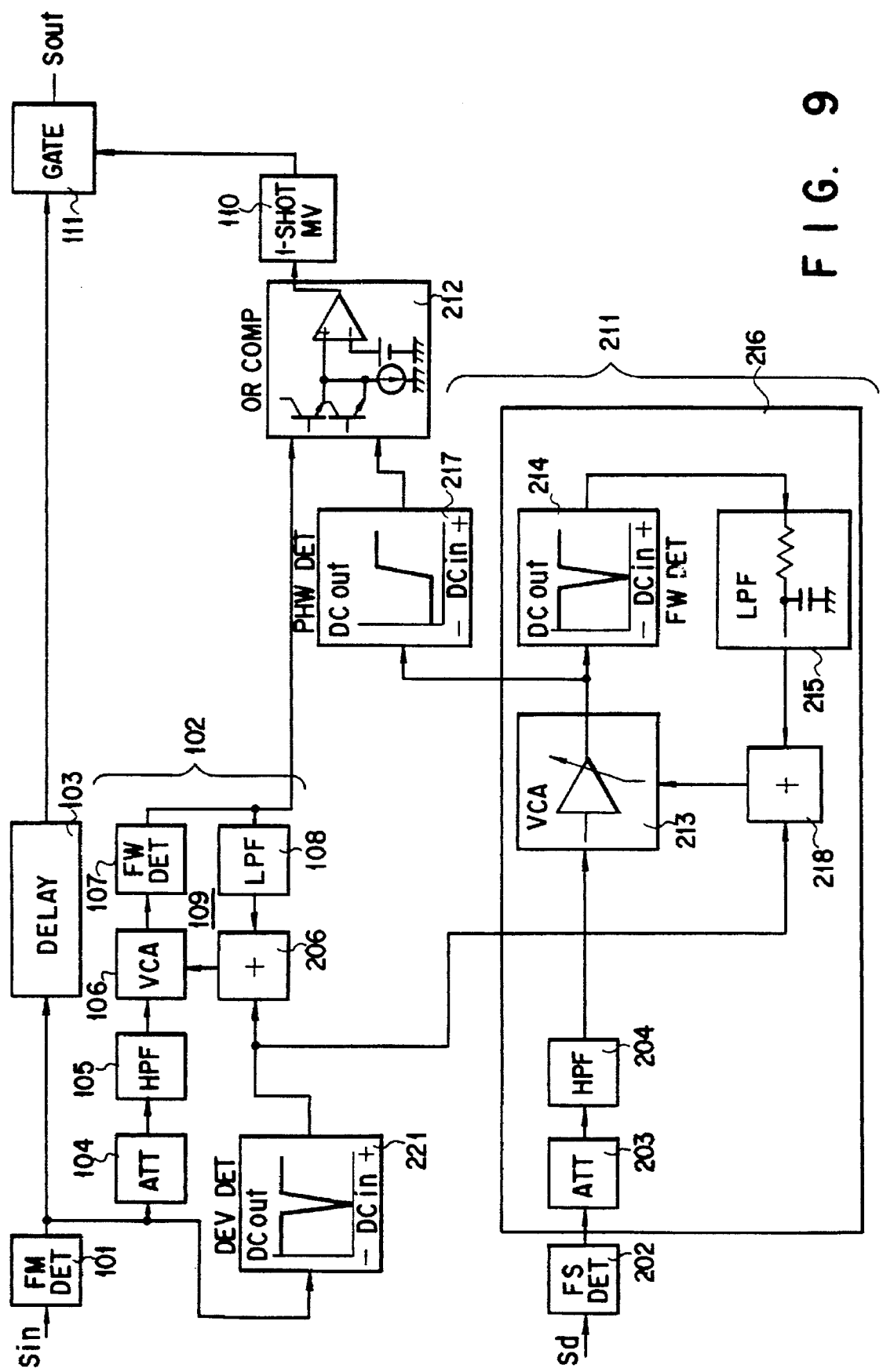
FIG. 9 is a block diagram showing the arrangement of the sixth embodiment of the present invention.

FIG. 9 is a block diagram showing the arrangement of a pulse noise canceler, applied to an FM tuner, according to the sixth embodiment of the present invention. The arrangement of FIG. 9 is obtained by changing the arrangement of FIG. 8 such that an output from a deviation detector 221 is also supplied to a noise AGC 109 in an AM pulse noise detector 211. In the arrangement of FIG. 9, an output from the deviation detector 221 is supplied to a VCA 213 through an adder 218. With the above arrangement, when both output signals from an FM pulse noise detector 102 and an AM pulse noise detector 211 are influenced by the output from the deviation detector 221. When an FM signal is over-deviated, the pulse noise detection sensibility of the AM pulse noise detector 211 is also decreased.

Figure 10:
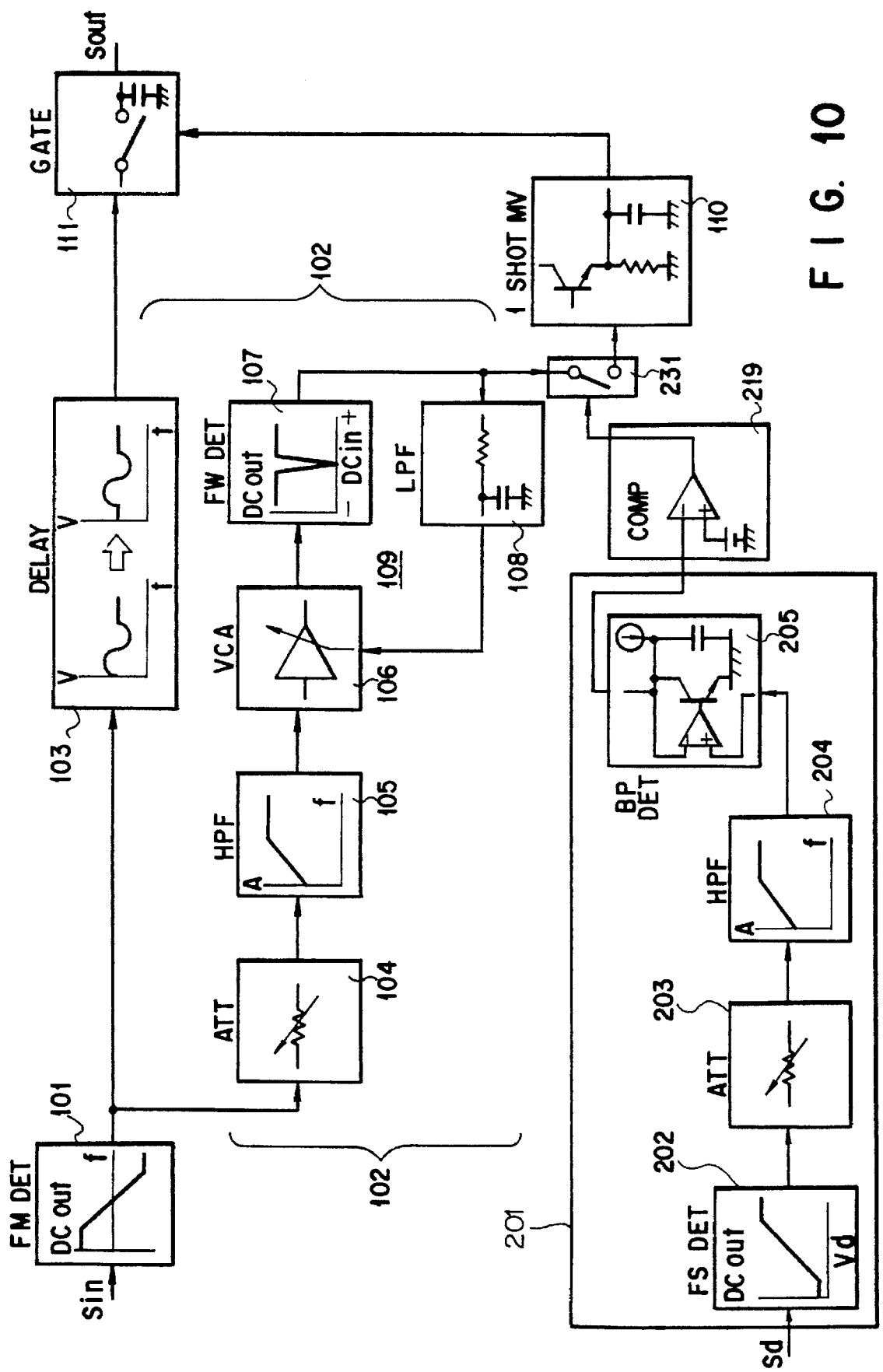
FIG. 10 is a block diagram showing the arrangement of the seventh embodiment of the present invention.

FIG. 10 is a block diagram showing a pulse noise canceler, applied to an FM tuner, according to the seventh embodiment of the present invention. Although the arrangement of FIG. 4 is designed such that an output signal from the over deviation detector 201 is incorporated to decrease the detection sensibility of the noise AGC 109 in the FM pulse noise detector 102, the arrangement of FIG. 10 is designed such that an output signal from an over deviation detector 201 is used to control a transfer control switch 231 through a comparator 219. The transfer control switch 231 is connected in a transmission path between the output terminal of the noise AGC 109 in the FM pulse noise detector 102 and the input terminal of a one-shot multivibrator 110 operated by an output from the noise AGC 109. When an output from the over deviation detector 201 exceeds a predetermined value set by the comparator 219, the transfer control switch 231 is turned off not to transmit the detection output from the noise AGC 109 to the one-shot multivibrator 110. According to the arrangement of FIG. 10, the same effect as in the arrangement of FIG. 4 can be expected.

Figure 11:
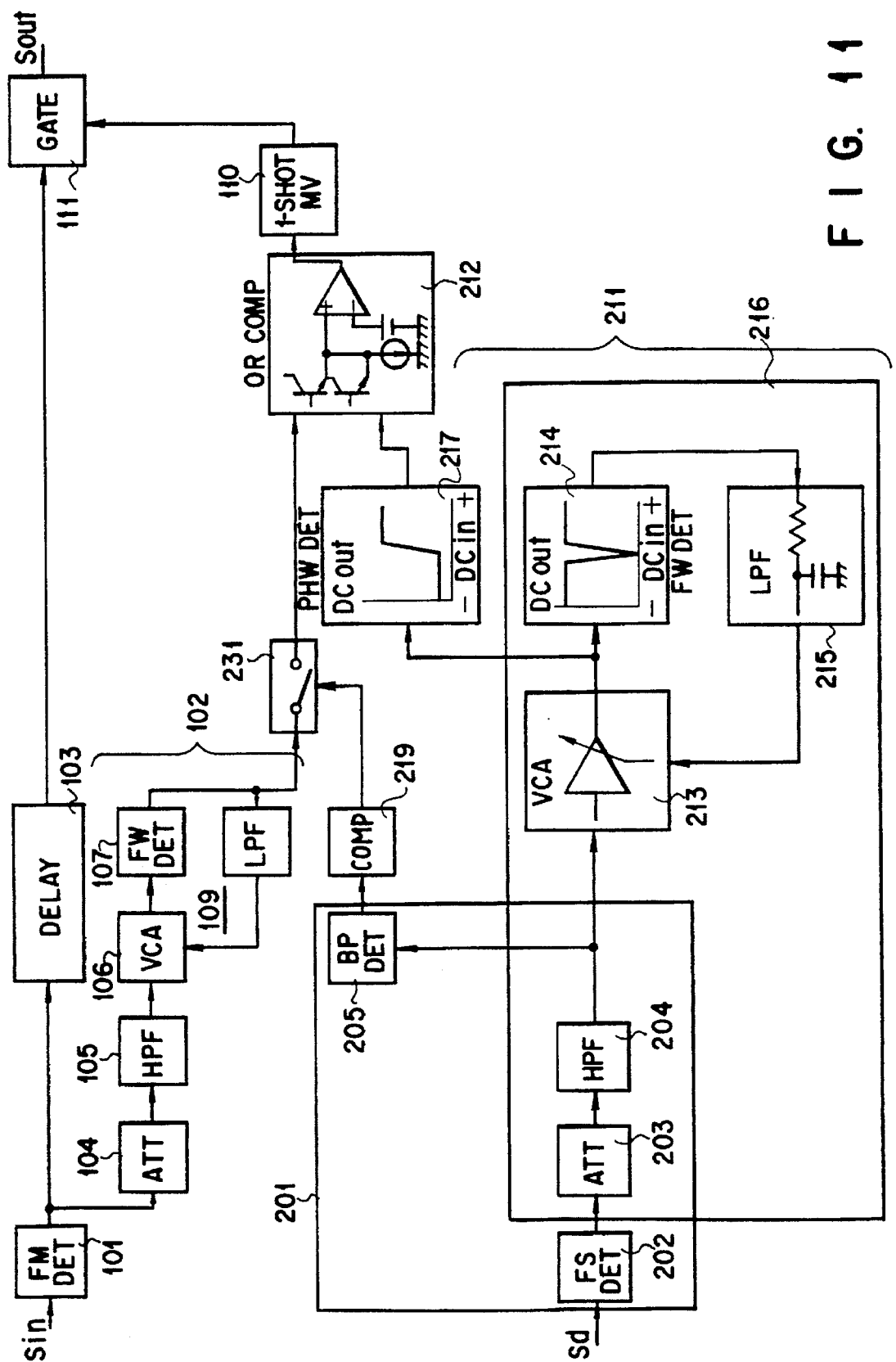
FIG. 11 is a block diagram showing the arrangement of the eighth embodiment of the present invention.

FIG. 11 is a block diagram showing a pulse noise canceler, applied to an FM tuner, according to the eighth embodiment of the present invention. The arrangement of FIG. 11 is obtained by adding an AM pulse noise detector 211 to the arrangement of FIG. 10. In the arrangement of FIG. 11, both output signals output from an FM pulse noise detector 102 and the AM pulse noise detector 211 and transmitted and controlled by a transfer control switch 231 are input to an OR comparator 212. An output from the OR comparator 212 is input to a one-shot multivibrator 110, and a holding gate 111 is controlled by a signal from the one-shot multivibrator 110. According to the arrangement of FIG. 11, the same effect as in the arrangement of FIG. 5 can be expected.

FIG. 12 is a block diagram showing a pulse noise canceler, applied to an FM tuner, according to the ninth embodiment of the present invention. Although the arrangement of FIG. 7 is designed such that an output signal from the deviation detector 221 is incorporated to decrease the detection sensitivity of the noise AGC 109 in the FM pulse noise detector 102, the arrangement of FIG. 12 is designed such that an output signal from an deviation detector 221 is used to control a transfer control switch 231 through a comparator 224. When an output from the deviation detector 221 exceeds a predetermined value set by the comparator 224, the transfer control switch 231 is turned off not to transmit the detection output from the noise AGC 109 to a one-shot multivibrator 110. According to the arrangement of FIG. 12, the same effect as in the arrangement of FIG. 7 can be expected.

Figure 13:
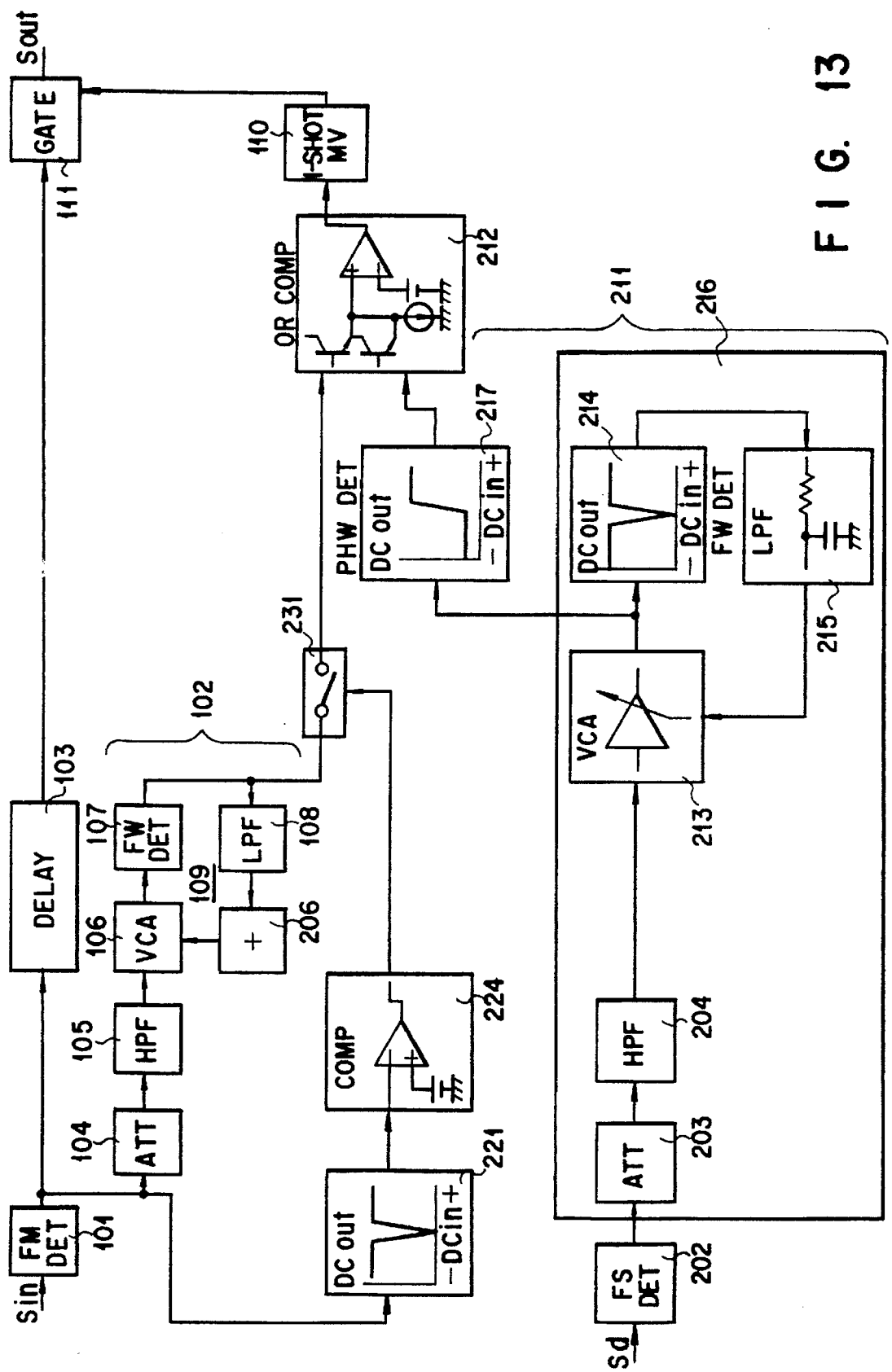
FIG. 13 is a block diagram showing the arrangement of the 10th embodiment of the present invention.

FIG. 13 is a block diagram showing a pulse noise canceler, applied to an FM tuner, according to the 10th embodiment of the present invention. The arrangement of FIG. 13 is obtained by adding an AM pulse noise detector 211 to the arrangement of FIG. 12. In the arrangement of FIG. 13, both output signals output from an FM pulse noise detector 102 and the AM pulse noise detector 211 and transmitted and controlled by a transfer control switch 231 are input to an OR comparator 212. An output from the OR comparator 212 is input to a one-shot multivibrator 110, and a holding gate 111 is controlled by a signal from the one-shot multivibrator 110. According to the arrangement of FIG. 13, the same effect as in the arrangement of FIG. 8 can be expected.

Figure 14:
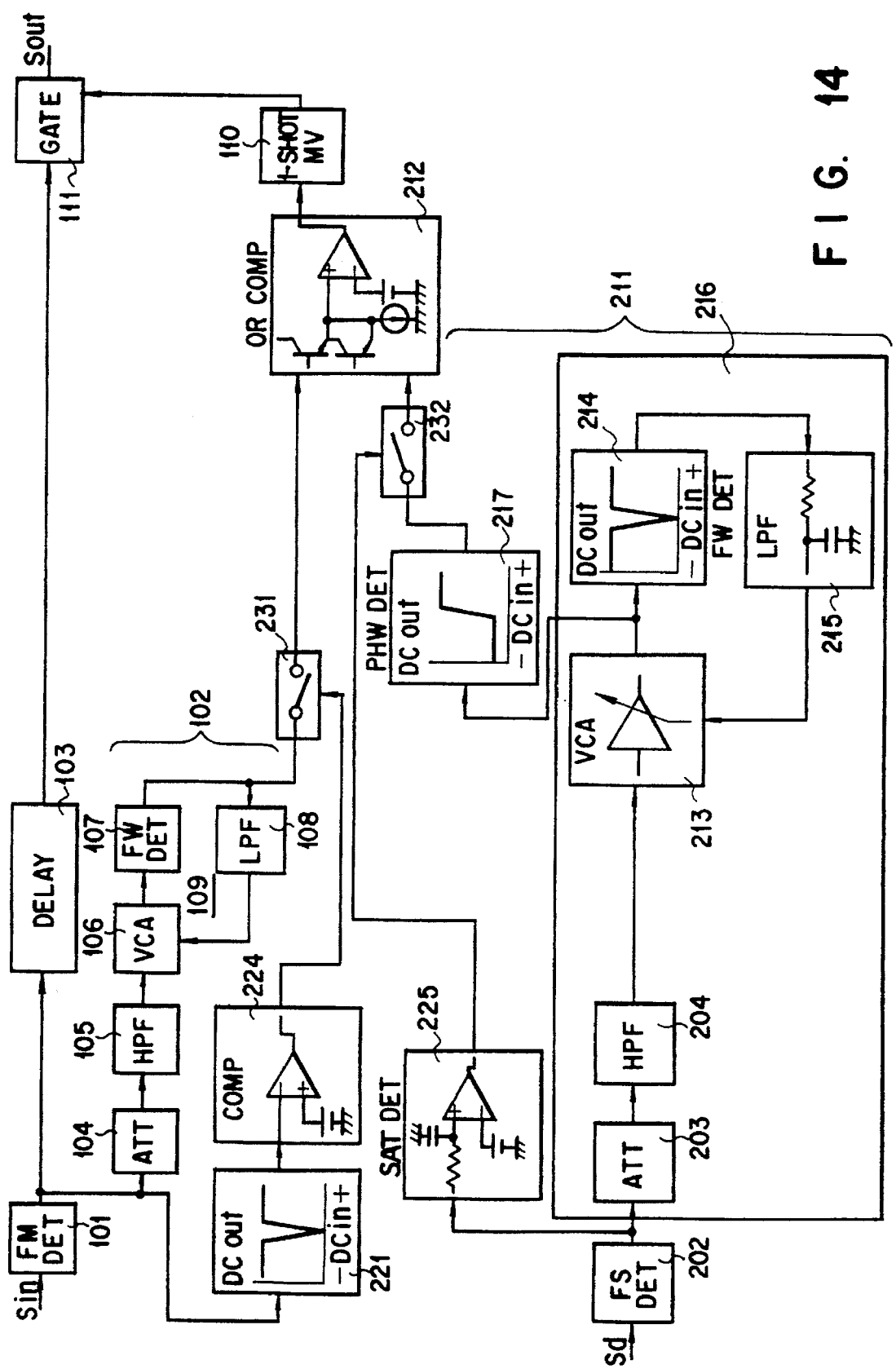
FIG. 14 is a block diagram showing the arrangement of the 11th embodiment of the present invention.

FIG. 14 is a block diagram showing the arrangement of a pulse noise canceler, applied to an FM tuner, according to the 11th embodiment of the present invention. The arrangement of FIG. 14 is slightly different from the arrangement of FIG. 13 in AM pulse noise detection system. More specifically, in the arrangement of FIG. 14, a saturation detector 225 and a transfer control switch 232 are newly arranged, and the transfer control switch 232 is controlled by an output signal from the saturation detector 225. The transfer control switch 232 is arranged in a transmission path between the output terminal of an AM pulse noise detector 211 and the input terminal of an OR comparator 212 operated by an output from the AM pulse noise detector 211. When the saturation detector 225 detects a timing at which a signal of the signal meter 202 is saturated, an output signal of saturation detector 225 changes. In this manner, the transfer control switch 232 is opened, so that the detection output from the AM pulse noise detector 211 is not transmitted to the OR comparator 212.

Figure 15:
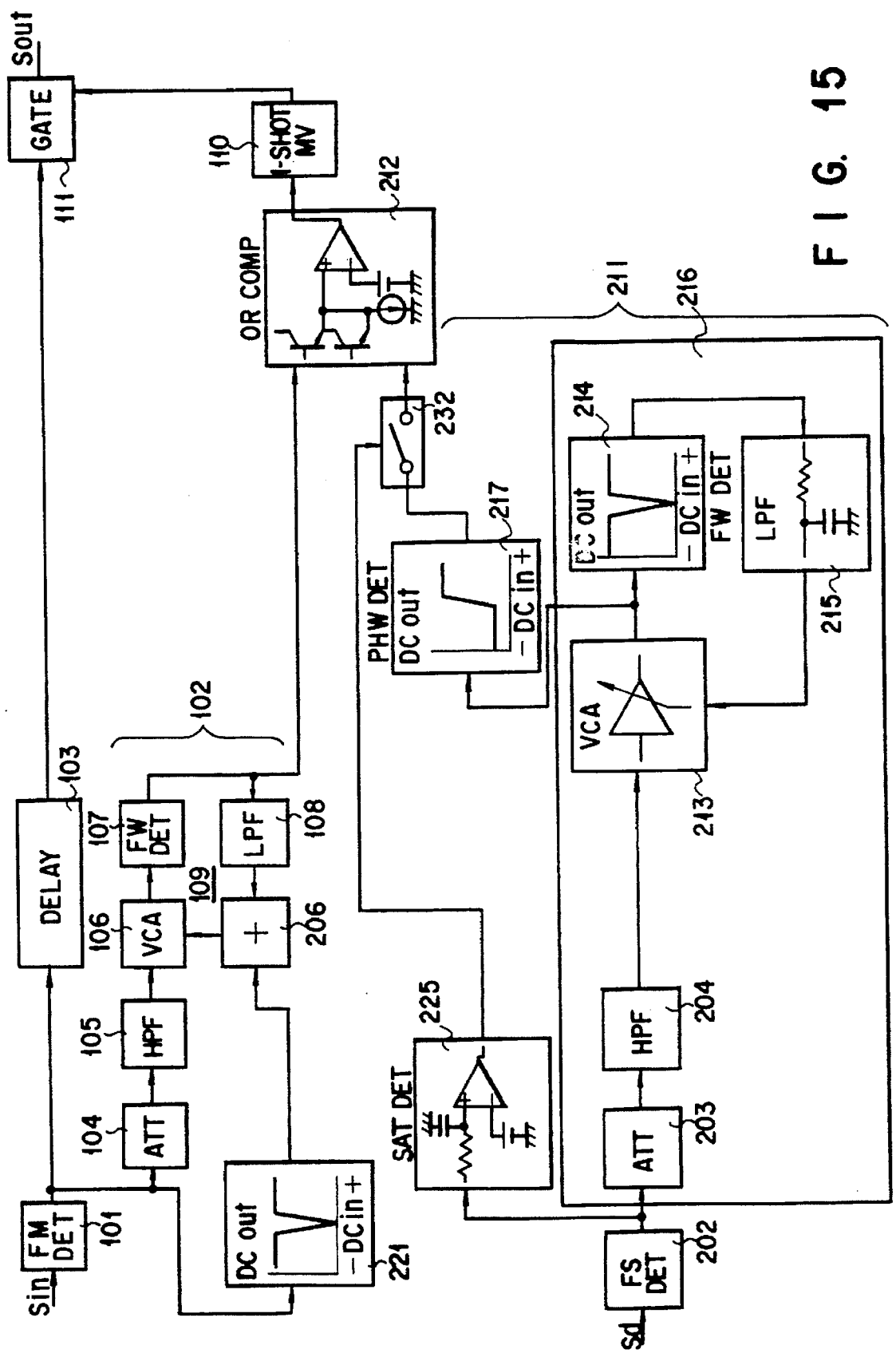
FIG. 15 is a block diagram showing the arrangement of the 12th embodiment of the present invention.

FIG. 15 is a block diagram showing the arrangement of a pulse noise canceler, applied to an FM tuner, according to the 12th embodiment of the present invention. The arrangement of FIG. 15 is obtained by removing the transfer control switch 231 from the arrangement of FIG. 14. In the arrangement of FIG. 15, a variable control amplifier (VCA) 222 and an adder 206 are arranged in place of the transfer control switch 231. An output from a deviation detector 221 is supplied to the control loop of a noise AGC 109 through the adder 206.

As has been described above, according to each of the embodiments of the present invention, an arrangement in which an increase in number of elements is extremely suppressed to obtain pulse noise canceling performance better than conventional pulse noise canceling performance can be obtained, thereby improving auditory characteristics. Therefore, the pulse noise canceler according to the present invention is preferably mounted in a system in which an FM processor LSI is arranged. In addition, when an AM pulse noise detecting function is added to the pulse noise canceler, preferable pulse noise detection can be performed under any radio wave condition. As a result, a pulse noise canceler having improved audibility and applied to an FM tuner can be provided.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A pulse noise canceler used in an FM tuner, comprising:
    an FM wave detector for demodulating an FM input signal;
    FM pulse noise detecting means for detecting a level of noise to be canceled from an output from said FM wave detector;
    over deviation detecting means for detecting a magnitude of an over deviation of an FM wave corresponding to the output signal from said FM wave detector;
    transfer control means having a function of holding and controlling an output signal from said FM wave detector in accordance with an output from said FM pulse noise detecting means; and
    transmission control means for disabling effective transmission of the output from said FM pulse noise detecting means to said transfer control means in accordance with a detection output from said over deviation detecting means.

2. A canceler according to claim 1, wherein said over deviation detecting means includes a full wave detector for detecting a magnitude of the over deviation according to an output amount of said FM wave detector.

3. A canceler according to claim 1, wherein said over deviation detecting means includes an over deviation detector for detecting a received field strength of said FM tuner to detect a bottom peak of an output signal from said FM tuner, thereby detecting the magnitude of the over deviation of an FM wave corresponding to an FM input signal exceeding an input band of said FM wave detector.

4. A canceler according to claim 1, wherein said transmission control means includes noise sensibility control means for decreasing a detection sensibility of said FM pulse noise detecting means in proportion to a detection amount of said over deviation detecting means.

5. A canceler according to claim 4, wherein said FM pulse noise detecting means includes an FM pulse noise detector having a mechanism for setting a noise sensibility by an output signal from said FM wave detector to constitute a noise AGC, said FM pulse noise detector detecting a level of noise to be canceled from said noise AGC, and said noise sensibility control means includes signal coupling means for reflecting an output amount of the said over deviation detecting means on said noise AGC to decrease a detection sensibility of said FM pulse noise detector in proportion to the output amount of said over deviation detecting means.

6. A canceler according to claim 1, wherein said transmission control means includes signal interrupting means for disabling an output from said FM pulse noise detecting means in accordance with a predetermined detection amount of said over deviation detecting means.

7. A canceler according to claim 6, wherein said FM pulse noise detecting means includes an FM pulse noise detector having a mechanism for setting a noise sensibility by an output signal from said FM wave detector to constitute a noise AGC, said FM pulse noise detector detecting a level of noise to be canceled from said noise ACG, and said signal interrupting means includes a switch for disabling transmission of an output from said FM pulse noise detector to said transfer control means in accordance with an output amount of said over deviation detecting means.

8. A canceler according to claim 1, wherein said transfer control means includes signal delay means for delaying an output signal from said FM wave detector by a predetermined period of time.

9. A canceler according to claim 1, further comprising:
AM pulse noise detecting means, arranged as a pulse noise reduction function of a system different from that of said FM pulse noise detecting means, for detecting a level of noise to be canceled when detection is performed by said over deviation detecting means; and
output coupling means for combining an influence of an output from said AM pulse noise detecting means to said transmission control means.

10. A canceler according to claim 9, wherein said AM pulse noise detecting means includes an AM pulse noise detector constituting an AM noise AGC for an output signal obtained by detecting a received field strength of said FM tuner itself, said AM pulse noise detector detecting a top peak of an output from said noise AGC to detect original pulse noise included in the FM input signal.

11. A canceler according to claim 10, wherein said output coupling means causes said transmission control means to function in accordance with a control signal output when a logical AND level of output signals from said FM pulse noise detector and said AM pulse noise detector reaches a predetermined level.

12. A canceler according to claim 10, wherein the received field strength of said FM tuner itself is detected by a signal meter.

13. A canceler according to claim 1, wherein an output signal from said full wave detector for detecting the magnitude of the deviation of the FM input signal is reflected on both said noise AGC in said FM pulse noise detector and said AM noise AGC in said AM pulse noise detector to cause said FM pulse noise detector and said AM pulse noise detector to function such that detection sensibilities of said FM pulse noise detector and said AM pulse noise detector decrease.

14. A canceler according to any one of claim 1, wherein said AM pulse noise detecting means further comprises weak field detecting means for detecting a weaker field strength than a threshold point of said FM tuner itself from an output signal obtained by detecting the received field strength of said FM tuner itself, so that said weak field detecting means influences said transmission control means.

15. A canceler according to claim 14, wherein an output signal from said weak field detecting means is a control signal for amplifying and controlling an output signal amount of said full wave detector.

16. A canceler according to claim 12, further comprising saturation detecting means for detecting a signal of said signal meter is saturated; and a switch for transfer-controlling signal transmission between said AM pulse noise detector and said output coupling means using an output signal from said saturation detecting means as a control signal.

17. A pulse noise canceler used in an FM tuner, comprising:
a gate circuit, to which a demodulated FM signal is input, for controlling whether the demodulated FM signal should be output to a subsequent circuit;
a pulse noise detecting circuit for detecting pulse noise in the demodulated FM signal;
an over deviation detecting circuit for detecting over deviation of the demodulated FM signal; and
a gate control circuit for controlling the gate circuit in accordance with an output from the pulse noise detecting circuit and an output of the over deviation detecting circuit.

18. A pulse noise canceler according to claim 17, wherein the gate control circuit controls the gate circuit such that, when the over deviation detecting circuit detects over deviation, the gate circuit is allowed to output, to the subsequent circuit, the demodulated FM signal input to the gate circuit.

19. A pulse noise canceler according to claim 17, wherein the gate circuit has a function of holding the demodulated FM signal and, if the demodulated FM signal should not be output to the subsequent circuit, the gate circuit outputs to the subsequent circuit a demodulated FM signal held immediately before.

20. A pulse noise canceler according to claim 17, further comprising an AM pulse noise detecting circuit for detecting AM pulse noise in the demodulated FM signal, wherein the gate control circuit controls the gate circuit in accordance with an output from the pulse noise detecting circuit, an output of the over deviation detecting circuit and an output from the AM pulse noise detecting circuit.

21. A pulse noise canceler according to claim 20, wherein the gate circuit has a function of holding the demodulated FM signal and, if the demodulated FM signal should not be output to the subsequent circuit, the gate circuit outputs to the subsequent circuit a demodulated FM signal held immediately before.

22. A pulse noise canceler according to claim 20, wherein the gate control circuit controls the gate circuit such that, when the AM pulse noise detecting circuit detects AM pulse noise, the gate circuit is interrupted to output, to the subsequent circuit, the demodulated FM signal input to the gate circuit.

23. A pulse noise canceler according to claim 20, wherein the gate control circuit controls the gate circuit such that, when the over deviation detecting circuit detects over deviation, the gate circuit is allowed to output, to the subsequent circuit, the demodulated FM signal input to the gate circuit.

24. A pulse noise canceler used in an FM tuner, wherein a signal determined to be pulse noise is prevented from being audio-output, the pulse noise canceler comprising:

an over deviation detecting circuit for detecting over deviation of a demodulated FM signal; and a circuit for audio-outputting the demodulated FM signal, when the over deviation detecting circuit detects over deviation.

* * * * *